(12) United States Patent
Shin

(10) Patent No.: US 8,492,257 B2
(45) Date of Patent: Jul. 23, 2013

(54) SEMICONDUCTOR DEVICE WITH VERTICAL TRANSISTOR AND METHOD FOR FABRICATING THE SAME

(75) Inventor: Jong-Han Shin, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 10 days.

(21) Appl. No.: 13/339,085

(22) Filed: Dec. 28, 2011

(65) Prior Publication Data

US 2012/0100704 A1   Apr. 26, 2012

Related U.S. Application Data

(62) Division of application No. 12/493,176, filed on Jun. 27, 2009, now Pat. No. 8,105,902.

(30) Foreign Application Priority Data

Mar. 23, 2009   (KR) .................. 10-2009-0024475

(51) Int. Cl.
 *H01L 21/3205* (2006.01)
 *H01L 21/4763* (2006.01)
(52) U.S. Cl.
 USPC ............. 438/585; 438/270; 257/E21.19
(58) Field of Classification Search
 USPC ............ 438/585, 270, 271, 259, 156, 173; 257/E21.19
 See application file for complete search history.

(56) References Cited

U.S. PATENT DOCUMENTS 7,323,418 B1 *   1/2008  Ngo et al. .................... 438/708
2006/0097304 A1   5/2006  Yoon et al.
2009/0170302 A1 *   7/2009  Shin et al. .................... 438/589

FOREIGN PATENT DOCUMENTS

| CN | 101335243 | 12/2008 |
| TW | 200428567 | 12/2004 |
| TW | 200507248 | 2/2005 |
| TW | 200739823 | 10/2007 |

OTHER PUBLICATIONS

Patent Certificate and Publication of Granted Chinese invention issued by the Chinese Patent Office on Aug. 29, 2012.
Preliminary Rejection issued by the Taiwanese Intellectual Property Office on Feb. 20, 2013.

* cited by examiner

*Primary Examiner* — Chuong A Luu
*Assistant Examiner* — Nga Doan
(74) *Attorney, Agent, or Firm* — IP & T Group LLP

(57) ABSTRACT

A semiconductor device with a vertical transistor includes a plurality of active pillars; a plurality of vertical gates surrounding sidewalls of the active pillars; a plurality of word lines having exposed sidewalls whose surfaces are higher than the active pillars and connecting the adjacent vertical gates together; and a plurality of spacers surrounding the exposed sidewalls of the word lines over the vertical gates.

7 Claims, 13 Drawing Sheets

SEMICONDUCTOR DEVICE WITH VERTICAL TRANSISTOR AND METHOD FOR FABRICATING THE SAME

CROSS-REFERENCE TO RELATED APPLICATIONS

This application is a division of U.S. patent application Ser. No. 12/493,176 filed on Jun. 27, 2009, now U.S. Pat. No. 8,105,902 which claims priority of Korean patent application number 10-2009-0024475, filed on Mar. 23, 2009, and is related to another application that is a division [Ser. No. 13/339,134] of U.S. patent application Ser. No. 12/493,176 and is filed on the same date as the filing date of this application. The disclosure of each of the foregoing applications is incorporated herein by reference in its entirety.

BACKGROUND OF THE INVENTION

The present invention relates to a semiconductor device, and more particularly, to a semiconductor device with a vertical transistor and a method for fabricating the same.

In a sub-60 nm DRAM process, formation of vertical transistors is desired in order to increase integration density of transistors in memory cells, to simplify a fabrication process, and to improve device characteristics. A vertical transistor includes an active pillar and a vertical gate surrounding the active pillar. Due to the vertical gate, a channel of a transistor is formed vertically.

Generally, an active pillar has a neck pillar and a top pillar, and a gate surrounds the neck pillar. However, the supporting force of the neck pillar is so weak that the active pillar may collapse in a subsequent process. To solve the limitations of the neck pillar structure, a method of forming a neck-free active pillar has been proposed.

FIGS. 1A and 1B are cross-sectional views illustrating conventional method for fabricating a semiconductor device with a vertical transistor. Referring to FIG. 1A, neck-free active pillars 12 are formed by etching a substrate 11 using a pad layer 13 as an etch barrier. The pad layer 13 is a layer where a pad oxide layer 13A and a pad nitride layer 13B are stacked. A channel region 12A and a drain region 12B are defined in the active pillar 12.

A buried bit line (BBL) 14 is formed by implanting impurity ions into the substrate 11 between the active pillars 12.

A gate dielectric layer 15 is formed, and a gate conductive layer 16 is formed over the gate dielectric layer 15 along a profile of a resulting structure.

Referring to FIG. 1B, the gate conductive layer 16 is etched back to form a vertical gate 16A surrounding the channel region 12A of the active pillar 12.

The gate conductive layer 16 has only to be deposited to a certain thickness, without fully filling the interval (e.g., space in-between) between the active pillars 12. Thus, the vertical gate 16A may be easily formed.

Since the pad nitride layer 13B formed over the active pillar 12 is used as a barrier when an etch process and a chemical mechanical polishing (CMP) process are performed several times, the pad nitride layer 13B needs to have a height of 1,500 Å or more for a subsequent process.

However, since the height of the active pillar is relatively high, it is difficult to remove the gate conductive layer 16 surrounding regions outside the channel region 12A (see a reference symbol "A"). Even though the gate conductive layer 16 is removed, the pad nitride layer 13B may be greatly damaged in a subsequent process (see a reference symbol "B"). As a result, a stable structure may not be obtained.

Moreover, as the semiconductor device shrinks even smaller in size, an aspect ratio of the active pillar to be formed increases and thus it is also difficult to form a stable active pillar.

Meanwhile, resistance of the buried bit line 14 is relatively extremely high because ion implantation is applied for forming the buried bit line 14 in the semiconductor device with the vertical transistor.

To overcome these limitations, silicide or a metal layer is formed over the buried bit line 14.

However, since the active pillar is relatively too high, it is difficult to apply a gap-fill of a metal layer for forming silicide due to a high aspect ratio. It is more likely to cause a bridge between the active pillars in a process of stripping the metal layer.

SUMMARY OF THE INVENTION

Exemplary embodiments of the present invention are directed to providing a semiconductor device, which is capable of preventing the collapse of an active pillar even though an aspect ratio increases, and a method for fabricating the same.

Exemplary embodiments of the present invention are also directed to providing a semiconductor device, which is capable of easily removing a gate conductive layer other than a channel region, and a method for fabricating the same.

Exemplary embodiments of the present invention are also directed to providing a semiconductor device, which is capable of reducing resistances of a bit line and a word line, and a method for fabricating the same.

In accordance with an aspect of the present invention, there is provided a semiconductor device, including: a plurality of active pillars; a plurality of vertical gates surrounding sidewalls of the active pillars; a plurality of word lines having exposed sidewalls whose surfaces are higher than the active pillars and connecting the adjacent vertical gates together; and a plurality of spacers surrounding the exposed sidewalls of the word lines over the vertical gates.

In accordance with another aspect of the present invention, there is provided a semiconductor device, including: a plurality of first active pillars; a plurality of vertical gates surrounding sidewalls of the first active pillars; a plurality of word lines having exposed sidewalls whose surfaces are higher than the first active pillars and connecting the adjacent vertical gates together; a plurality of spacers surrounding the exposed sidewalls of the word lines over the vertical gates; and a plurality of second active pillars formed over the first active pillars.

The second active pillars may include an epitaxial layer.

The spacers may include a nitride layer.

In accordance with still another aspect of the present invention, there is provided a method for fabricating a semiconductor device, the method including: etching a substrate to form a plurality of first active pillars; forming a plurality of gate conductive layers surrounding sidewalls of the first active pillars; forming a plurality of word lines buried between the gate conductive layers to connect the adjacent gate conductive layers; forming a plurality of vertical gates by partially etching upper portions of the gate conductive layers to partially expose sidewalls of the word lines; and growing a plurality of second active pillars over the first active pillars.

In accordance with a further aspect of the present invention, there is provided a method for fabricating a semiconductor device, the method including: forming a plurality of first active pillars by etching a substrate using a pad layer as an etch barrier; forming a plurality of gate conductive layers surrounding sidewalls of the first active pillars and the pad layer; forming a plurality of word lines buried between the gate conductive layers to connect the adjacent gate conductive layers; removing the pad layer; forming a plurality of vertical gates by partially etching upper portions of the gate conductive layers to partially expose sidewalls of the word lines; forming an etch barrier layer over a resulting structure including the vertical gates; forming an interlayer dielectric layer over the etch barrier layer; forming a plurality of contact holes by etching the interlayer dielectric layer, where the etching stops at the etch barrier layer; etching the etch barrier layer under the contact holes to expose surfaces of the first active pillars; and forming a plurality of second active pillars over the exposed first active pillars.

In accordance with a further aspect of the present invention, there is provided a method for fabricating a semiconductor device, the method comprising: forming a plurality of first active pillars by etching a substrate using a pad layer as an etch barrier; forming a plurality of gate conductive layers surrounding sidewalls of the first active pillars and the pad layer; forming a plurality of word lines buried between the gate conductive layers to connect the adjacent gate conductive layers; removing the pad layer; forming a plurality of vertical gates by partially etching upper portions of the gate conductive layers to partially expose sidewalls of the word lines; forming a plurality of spacers surrounding exposed sidewalls of the word lines over the vertical gates; and forming a plurality of second active pillars over the first active pillars.

DESCRIPTION OF SPECIFIC EMBODIMENTS

Figure 1A:
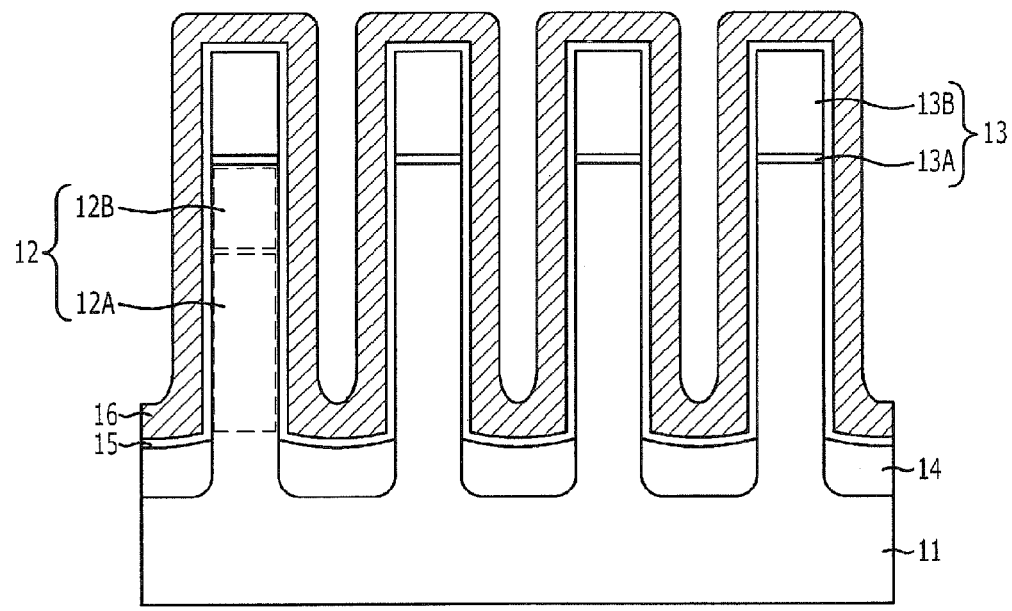
FIGS. 1A and 1B are cross-sectional views illustrating a conventional method for fabricating a semiconductor device with a vertical transistor.
Figure 1B:
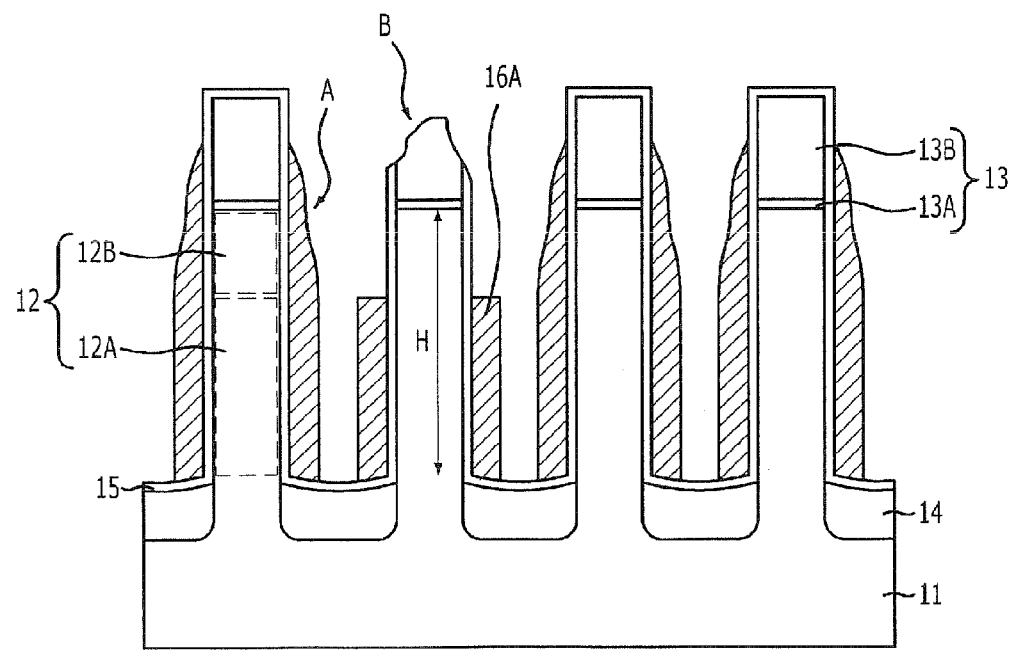

Other objects and advantages of the present invention can be understood by the following description, and become apparent with reference to the embodiments of the present invention.

Referring to the drawings, the illustrated thickness of layers and regions are exemplary and may not be exact. When a first layer is referred to as being "on" a second layer or "on" a substrate, it could mean that the first layer is formed directly on the second layer or the substrate, or it could also mean that a third layer may exist between the first layer and the substrate. Furthermore, the same or like reference numerals represent the same or like constituent elements, although they appear in different embodiments or drawings of the present invention.

Figure 2:
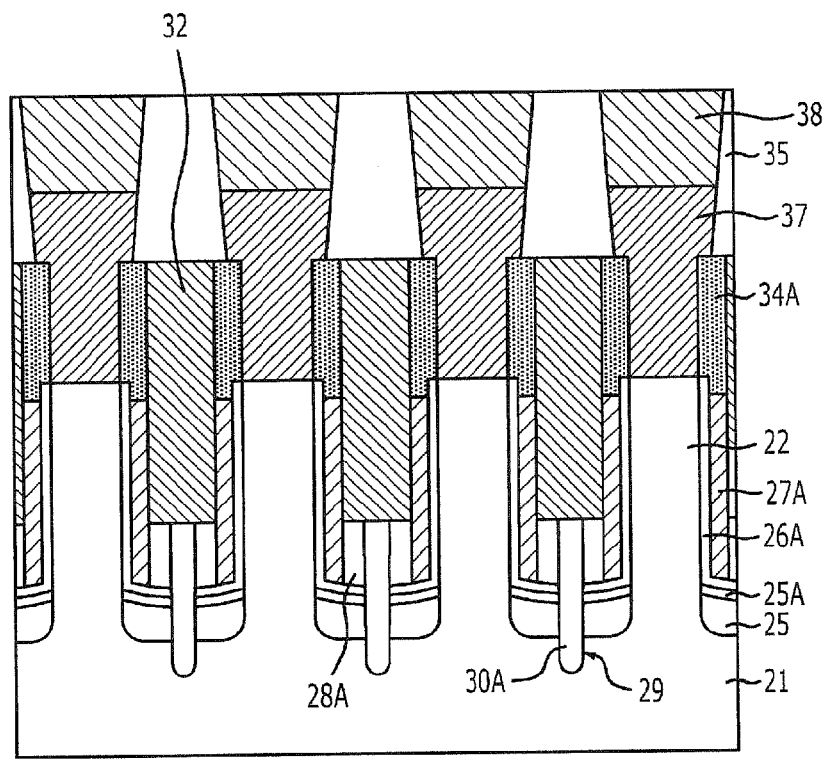
FIG. 2 is a cross-sectional view of a semiconductor device with a vertical transistor in accordance with a first embodiment of the present invention.

FIG. 2 is a cross-sectional view of a semiconductor device with a vertical transistor in accordance with a first embodiment of the present invention. Referring to FIG. 2, the semiconductor device includes a plurality of first active pillars 22, a plurality of vertical gates 27A, a plurality of word lines 32, and a plurality of spacers 34A. The first active pillars 22 are disposed over a substrate 21. The vertical gates 27A surround sidewalls of the first active pillars 22. The word lines 32 have exposed sidewalls whose surfaces are higher than the first active pillars 22, and connect the adjacent vertical gates 27A together. The spacers 34A surround the exposed sidewalls of the word lines 32 over the vertical gates 27A. Moreover, the semiconductor device further includes a plurality of second active pillars 37 and a plurality of buried bit lines 25. The second active pillars 37 are disposed over the first active pillars 22 and become drain regions of the vertical transistors. The buried bit lines 25 are disposed in the substrate 21 between the first active pillars 22 and separated from one another by trenches 29. Gate dielectric patterns 26A are disposed between the vertical gates 27A and the first active pillars 22, and second interlayer dielectric layers 30A are buried in the trenches that separate the buried bit lines 25. First interlayer dielectric layers 28A are disposed between the adjacent vertical gates 27A. The second active pillars 37 may include silicon epitaxial layers grown by epitaxial growth to partially fill contact holes defined by third interlayer dielectric layers 35, and the remaining portions of the contact holes may be filled with storage node contacts 38.

The spacers 34A may include a nitride layer, and the vertical gates 27A and the word lines 32 may include a metal layer.

The first active pillars 22 become channel regions of the vertical transistors, and the second active pillars 37 become drain regions of the vertical transistors. The spacers 34A function to enable the second active pillars 37 to be stably grown, and prevent a bridge between the second active pillars 37 and the word lines 32. As will be described later, the spacers 34A also function as barriers to achieve a self align contact (SAC).

Figure 3A:
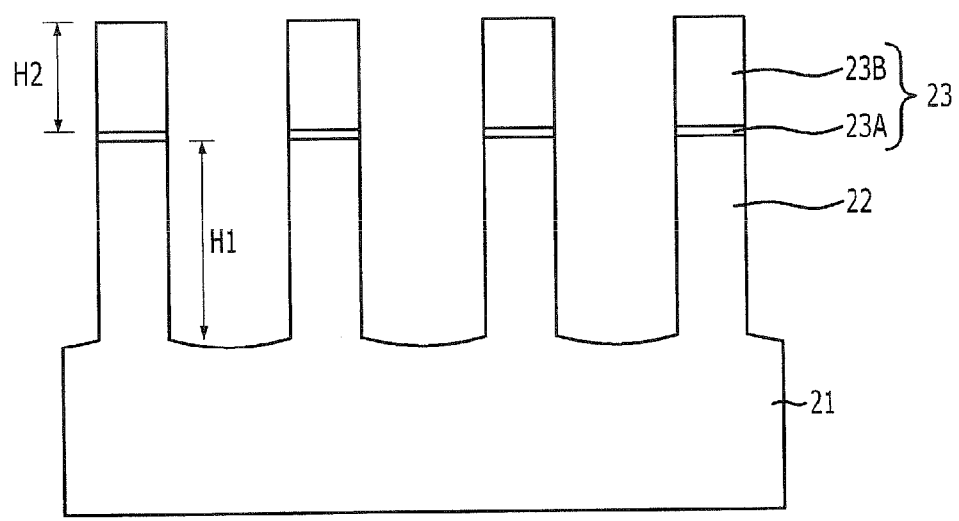
FIGS. 3A to 3L are cross-sectional views illustrating a method for fabricating the semiconductor device of FIG. 2.

FIGS. 3A to 3L are cross-sectional views illustrating a method for fabricating the semiconductor device of FIG. 2. Referring to FIG. 3A, first active pillars 22 are formed on a substrate 21. The first active pillars 22 have a pillar structure where they are arranged in a dot matrix form, and are active regions where channels of transistors will be formed. The first active pillars 22 have a rod-type neck-free structure. A stable structure that is strongly-resistant to collapse can be obtained because of the neck-free structure. The first active pillars 22 have a height H1 of 900 Å or less. When the height H1 of the first active pillars 22 is 1,500 Å or more, collapse may occur in a subsequent process. The height H1 of the first active pillars 22 is reduced to 900 Å or less in order to limit the first active pillars 22 to the height at which the channel region will be formed. As will be described below, second active pillars for drain regions are formed in a subsequent process. According to the prior art, the high active pillars are formed in view of the channel region and the source region. However, in accordance with the embodiment of the present invention, the first active pillars functioning as the channel regions are first formed, and the second active pillars functioning as the drain regions are then formed in a subsequent process. In this manner, the height of the first active pillars 22 can be reduced because the first active pillars 22 functioning as the channel regions are first formed.

Since the first active pillars 22 are formed for the channel regions, their height is maximally reduced. The height of the first active pillars 22 is a range of approximately 600 Å to approximately 1,500 Å, specifically approximately 600 Å to approximately 1,000 Å.

The first active pillars 22 are formed by an etch process using pad layers 23.

The substrate 21 may include a silicon substrate. When the substrate 21 is a silicon substrate, an etch process for forming the active pillars 22 may be performed by a dry etch process that uses $Cl_2$ gas or HBr gas alone or a mixed gas of $Cl_2$ gas and HBr gas.

The pad layers 23 have a stacked structure in which a pad oxide layer 23A and a pad nitride layer 23B are sequentially formed. The pad oxide layer 23A has a height ranging from approximately 100 Å to approximately 300 Å, and the pad nitride layer 23B has a height ranging from approximately 300 Å to approximately 1,000 Å. To be specific, the pad nitride layer 23B is formed at a height H2 of less than 700 Å in order to prevent its collapse in a subsequent process. A total height of the pad layer 23 accommodates formation of the first active pillars 22. Thus, the pad layers 23 may not be formed to be relatively thick, and thus, it is possible to prevent the first active pillars 22 from being collapsed by weight of the pad layers 23.

Figure 3B:
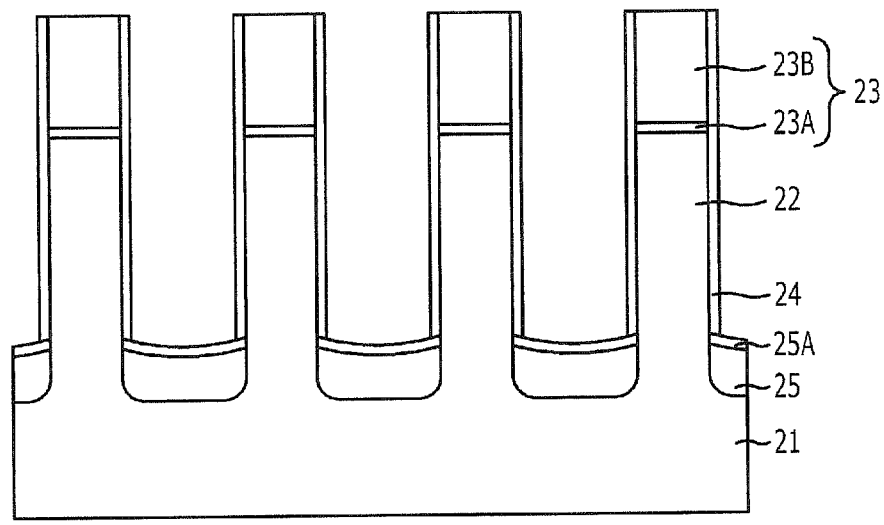

Referring to FIG. 3B, buried bit lines (BBL) 25 are formed by implanting impurity ions into the substrate 21 between the first active pillars 22. The buried bit lines 25 may be formed by implanting N-type impurity ions, for example, phosphorus (P) ions or arsenic (As) ions, at impurity concentration of $1 \times 10^{15}$ atoms/cm$^3$ or more.

Although the buried bit lines 25 may be formed after the ring-shaped vertical gates, they may also be formed immediately after the formation of the first active pillars 22 which can easily ensure an area for forming the buried bit lines having sufficiently low resistance and to which a silicide process or the like can be sufficiently performed.

The ion implantation process for forming the buried bit lines 25 may be performed after sacrificial spacers 24 are formed. Since the sacrificial spacers 24 are formed by a spacer etch process after depositing an oxide layer, the sacrificial spacers 24 may be formed to cover sidewalls of the first active pillars 22 and the pad layers 23. In the ion implantation using the sacrificial spacers 24, it is possible to prevent impurity ions from being implanted into the sidewalls of the first active pillars 22. The sacrificial spacers 24 have a thickness ranging from approximately 50 Å to approximately 300 Å. Meanwhile, the sacrificial spacers 24 may be formed after the oxide layer is deposited, without any spacer etch process. Accordingly, the sacrificial spacers 24 can function as a passivation layer that protects the surface of the substrate 21 from being attacked by impact of the ion implantation process.

As mentioned above, after the buried bit lines 25 are formed, a silicide layer 25A may be formed for further reducing a sheet resistance of the buried bit lines 25. The silicide layer 25A may include a titanium silicide layer, a cobalt silicide layer, or a nickel silicide layer. As known, the silicide layer 25A may be formed by depositing a metal layer such as a titanium, cobalt or nickel layer, performing a thermal treatment on the deposited metal layer, and inducing a reaction with between the metal layer and the substrate where the buried bit lines 25 are formed. The non-reacted metal layer formed of silicide may be removed by a wet etch process.

Figure 3C:
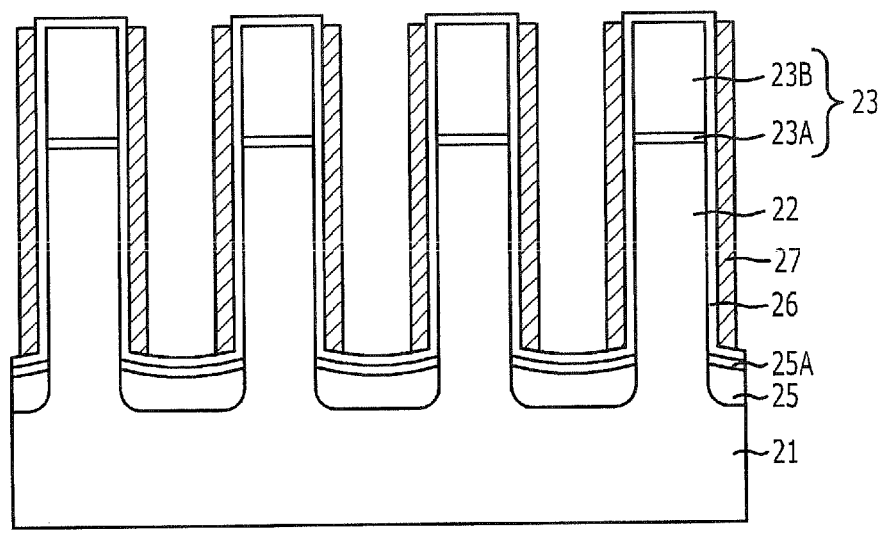

Referring to FIG. 3C, the sacrificial spacers 24 are removed and a gate dielectric layer 26 is formed. The gate dielectric layer 26 may be formed by a deposition process, a thermal oxidation process, or a radical oxidation process. The gate dielectric layer 26 has a thickness ranging from approximately 30 Å to approximately 80 Å.

A gate conductive layer 27 is formed along a profile of a resulting structure including the gate dielectric layer 26 and is etched back. Accordingly, the gate conductive layer 27 surrounding the sidewalls of the first active pillars 22 and the pad layers 23 remains. That is, the gate conductive layer 27 is normally formed because of the low height of the first active pillars 22. The deposited thickness of the gate conductive layer 27 is in a range from approximately 50 Å to approximately 200 Å. To be specific, the gate conductive layer 27 may include a metal nitride layer. For example, the gate conductive layer 27 includes a titanium nitride (TiN) layer or a tantalum nitride (TaN) layer. In this case, the gate conductive layer 27 may be formed by stacking the tantalum nitride layer and the titanium nitride layer. In case of stacking the tantalum nitride layer and the titanium nitride layer, the tantalum nitride layer is formed to a small thickness ranging from approximately 20 Å to approximately 60 Å and functions as a diffusion barrier.

The gate conductive layer 27 is further etched to surround the sidewalls of the first active pillars 22 in a subsequent process, and becomes vertical gates surrounding the sidewalls of the first active pillars 22.

Figure 3D:
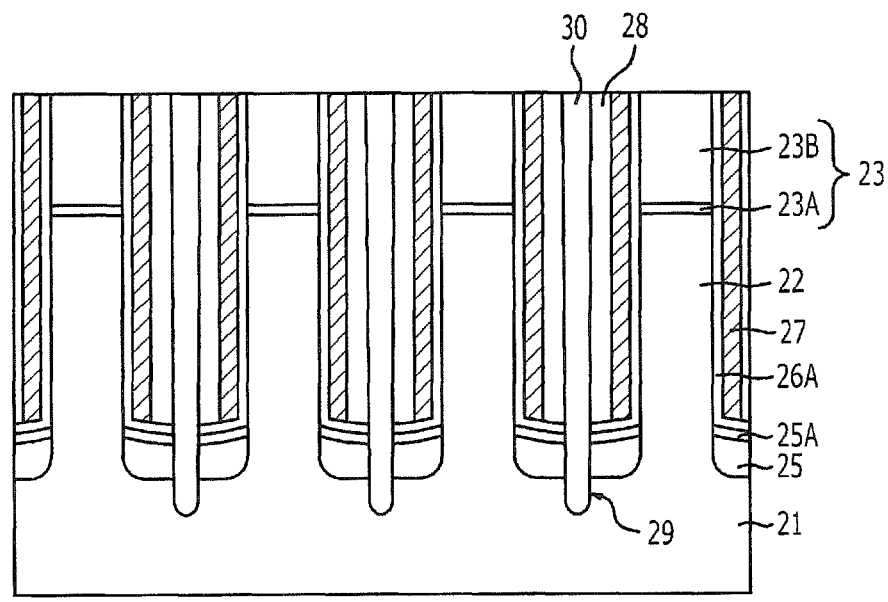

Referring to FIG. 3D, an interlayer dielectric layer is formed over a resulting structure including the gate conductive layer 27. In this case, the interlayer dielectric layer is formed to fill a gap between the first active pillars 22, and a planarization process using CMP is performed on the interlayer dielectric layer so that it remains only in an interval between the first active pillars 22, and thereby a first interlayer dielectric layer 28 is formed. In the planarization process, the gate dielectric layer 26 formed on the pad layers 23 is also planarized and remains as a residual gate dielectric pattern 26A.

The first interlayer dielectric layer 28 may be formed of oxide, for example, high-density plasma (HDP) oxide, borophosphorous-silicate glass (BPSG), spin on dielectric (SOD), tetra-ethyl-ortho-silicate (TEOS), undoped silicate glass (USG), and atomic layer deposition (ALD) oxide. To be specific, the first interlayer dielectric layer 28 is formed of flowable oxide such as SOD or BPSG. The first interlayer dielectric layer 28 has a thickness ranging from approximately 500 Å to approximately 6,000 Å.

The planarization process using CMP may be performed until the pad layers 23 are completely exposed, or may be performed until the pad layers 23 remains at a certain thickness. In case where the planarization process is performed until the pad layers 23 are completely exposed, an oxide layer may be further deposited to a thickness ranging from approximately 200 Å to approximately 100 Å in order to minimize loss of the pad nitride layer 23B in a trench forming process for isolating the subsequent buried bit lines 25.

The CMP process is performed using a slurry which has silica or ceria abrasive particles and has a polishing selectivity of 40 or more between the oxide layer and the nitride layer. Therefore, when the pad nitride layer 23B is exposed, the polishing is stopped, or only the first interlayer dielectric layer 28 is polished, so that the first interlayer dielectric layer 28 remaining on the pad layer 23 is uniformly left.

In the current embodiment, the planarization process may be performed to expose the pad layer 23.

The buried bit lines 25 are isolated. That is, trenches 29 isolating the buried bit lines 25 are formed by etching the first interlayer dielectric layer 28, the gate dielectric layer 26, and the substrate 21 to a certain depth through a BBL mask process (not shown).

An interlayer dielectric layer gap-filling the trenches 29 are formed. The interlayer dielectric layer gap-filling the trenches 29 may include an oxide layer. For example, the interlayer dielectric layer includes HDP oxide, BPSG, SOD, TEOS, USG, ALD oxide. To be specific, the interlayer dielectric layer includes flowable oxide such as SOD or BPSG.

A planarization process using CMP is performed on the interlayer dielectric layer gap-filling the trenches 29 to form a second interlayer dielectric layer 30 remaining only in a gap between the first active pillars 22.

The planarization process using CMP may be performed to completely expose the pad layer 23. The CMP process is performed using a slurry which has silica or ceria abrasive particles and has a polishing selectivity of 40 or more between the oxide layer and the nitride layer. Accordingly, the polishing is stopped when the pad nitride layer 23B is exposed. Through such a polishing, the upper portion of the gate dielectric layer 26 is removed to form a first gate dielectric pattern 26A.

Figure 3E:
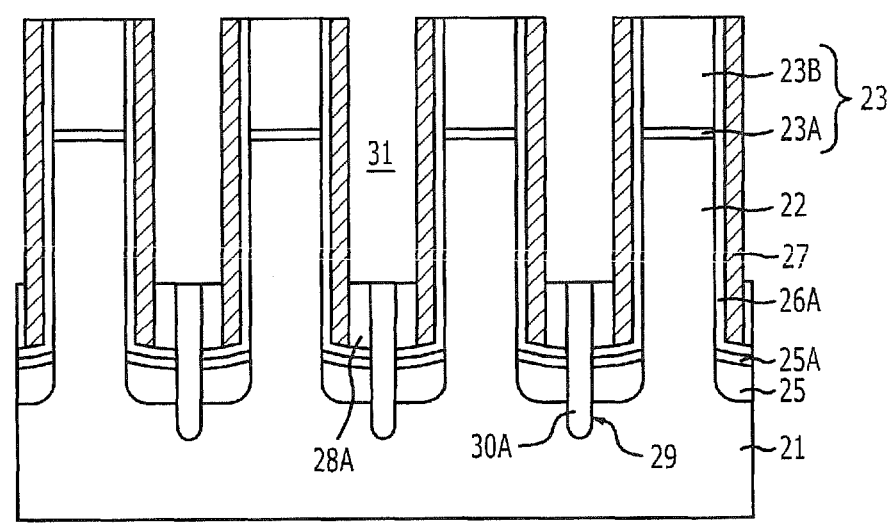

Referring to FIG. 3E, an etch process for forming a damascene word line is performed to form damascene patterns 31. When seen in a plane, photoresist patterns (not shown) are formed in a direction intersecting with the buried bit lines 25. The second interlayer dielectric layer 30 and the first interlayer dielectric layer 28 gap-filled between the gate conductive layers 27 are partially removed by a dry etch process. The second interlayer dielectric layer 30 and the first interlayer dielectric layer 28 remaining on the gate conductive layers 27 are removed by a wet etch process. In this way, due to the removal of the interlayer dielectric layers remaining on the gate conductive layers 27, subsequent word lines and vertical gates are directly contacted together, thus the word lines at low resistances are maintained.

After the damascene patterns 31 are formed, the first interlayer dielectric layer and the second interlayer dielectric layer remain as indicated by reference symbols 28A and 30A, respectively.

Figure 3F:
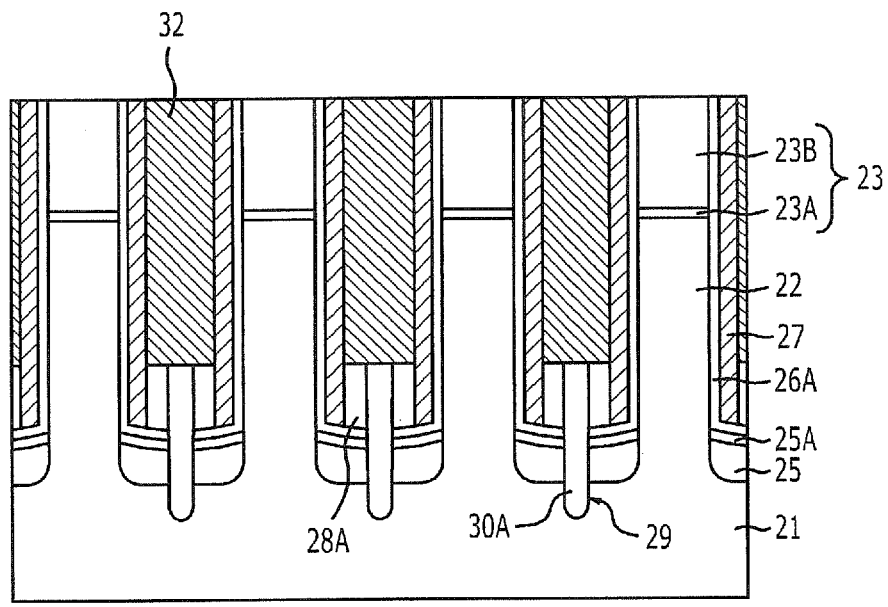

Referring to FIG. 3F, an isolation process is performed after a word line conductive layer is deposited over a resulting structure to fill the damascene patterns 31. Accordingly, word lines 32 filled within the damascene patterns 31 are formed, and the word lines 32 connect the adjacent gate conductive layers 27. The word lines 32 may be formed of titanium nitride (TiN) or tungsten (W). The word lines 32 may be isolated by a CMP process. Since the word lines 32 are formed of a metal, a metal CMP process is performed so that the polishing of the pad layer 23 is stopped at the pad layer 23. The metal CMP process may be performed using a slurry which has fumed silica or colloidal silica or alumina abrasive particles, has pH of 6 or less, and has a polishing selectivity of 10 or more between the tungsten layer and the nitride layer. When the pad nitride layer 23B is exposed, the polishing is stopped.

Since the word lines 32 are formed by a damascene process, they can be formed at a constant height. Thus, a variation in the sheet resistance (Rs) of the word lines 32 can be kept at minimum.

Figure 3G:
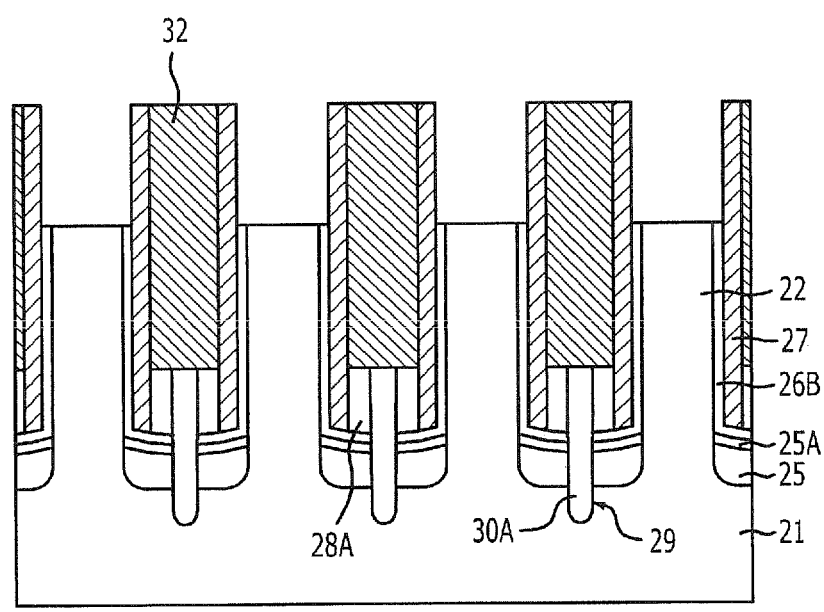

Referring to FIG. 3G, the pad layer 23 is removed. Since the pad layer 23 has a stacked structure of the pad nitride layer 23B and the pad oxide layer 23A, a wet etch process may be used for removing the pad nitride layer 23B and the pad oxide layer 23A. The pad nitride layer 23B may be removed using a phosphoric acid solution ($H_3PO_4$), and the pad oxide layer 23A may be removed using an HF-containing solution.

When the pad oxide layer 23A is wet etched, the first gate dielectric patterns 26A on the sidewalls of the pad layer 23 are also removed partially to form second gate dielectric patterns 26B. Therefore, the second gate dielectric patterns 26B are high enough to cover the sidewalls of the first active pillars 22.

As such, the top surfaces of the first active pillars 22 are exposed by removing the pad layer 23.

Figure 3H:
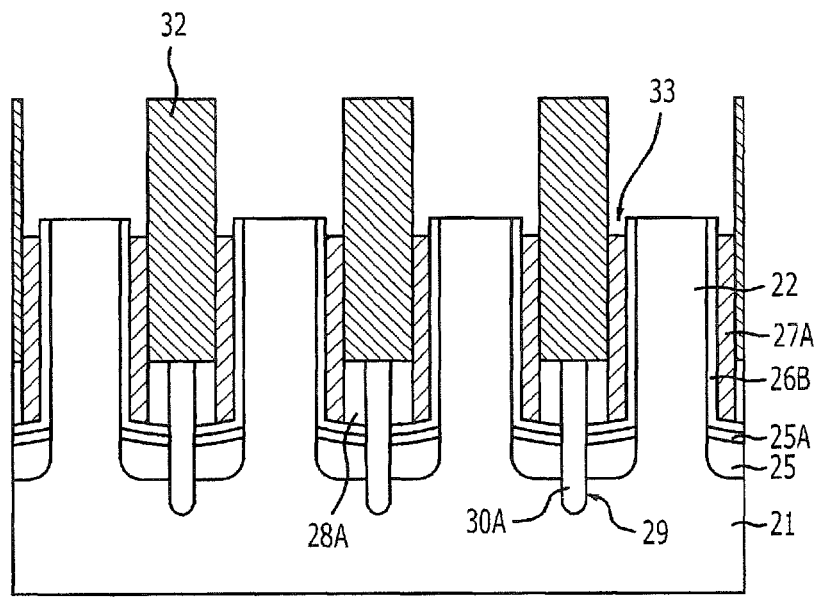

Referring to FIG. 3H, a portion of the gate conductive layer 27 is selectively etched to form vertical gates 27A whose height is lower than the first active pillars 22. The gate conductive layer 27 is etched by a dry etch process in order to achieve a high selectivity between the gate conductive layer 27 and the word line 32. In another embodiment, the gate conductive layer 27 and the word line 23 may be simultaneously etched by a wet etch process, without selectivity.

Figure 5A:
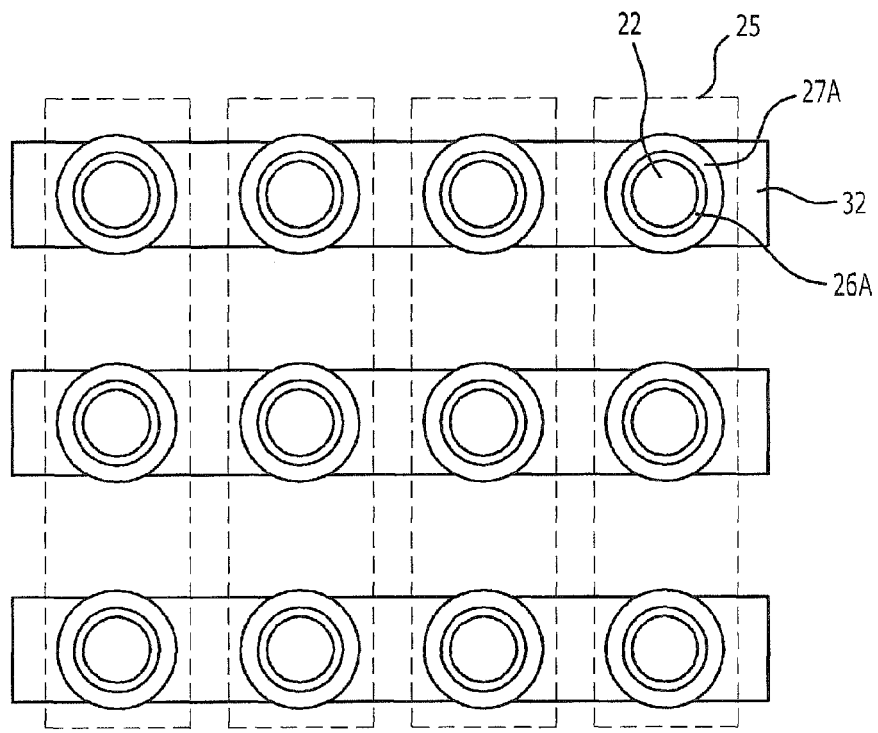
FIG. 5A is a plan view illustrating state in which vertical gates are formed.

After the vertical gates 27A are formed, grooves 33 are formed over the vertical gates 27A because of height difference of the first active pillars 22, the vertical gates 27A, and the word lines 32. Due to the grooves 33, sidewalls of the word lines 32 are partially exposed. FIG. 5A is a plan view illustrating state in which the vertical gates 27A are formed. As can be seen from FIG. 5, the vertical gates 27A surround the sidewalls of the first active pillars 22.

Figure 3I:
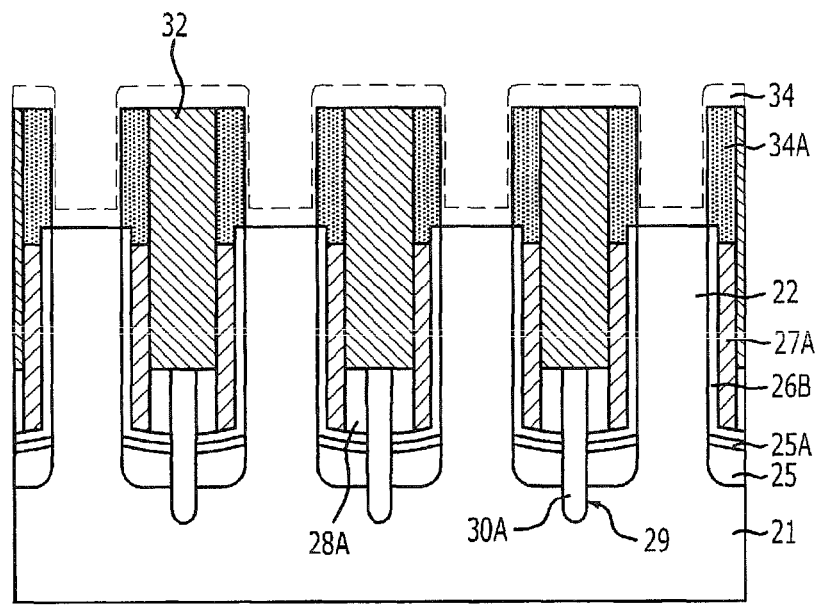

Referring to FIG. 3I, a spacer layer 34 is formed over a resulting structure to gap-fill the grooves 33. The spacer layer 34 is etched back to form spacers 34A filling the grooves 33. The spacers 34A cover the exposed sidewalls of the word lines 32 over the vertical gates 27A.

The spacers 34A are formed by depositing a nitride layer to a thickness ranging from approximately 100 Å to approximately 300 Å and a spacer etch process is performed to expose the surfaces of the first active pillars 22.

The spacers 34A are formed so that a self align contact (SAC) may be formed in a subsequent contact etch process. Moreover, the spacers 34A prevent bridge between subsequent second active pillars and the vertical gates 27A or between subsequent second active pillars and the word lines 32, and also function as a passivation layer to enable subsequent second active pillars to be grown stably on the first active pillars 22.

Figure 5B:
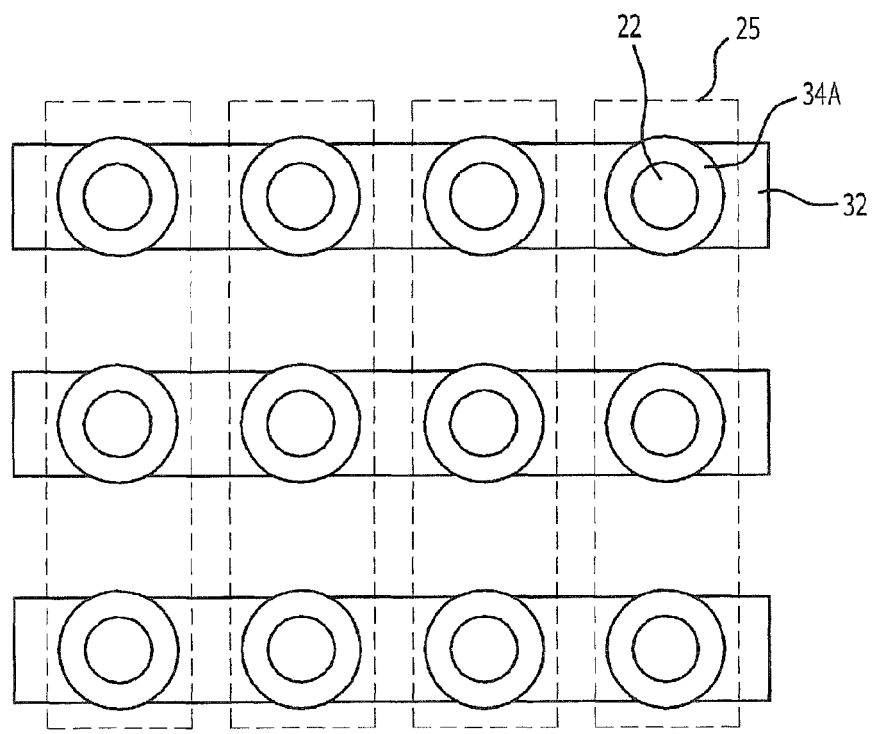
FIG. 5B is a plan view illustrating a state in which spacers are formed.

FIG. 5B is a plan view illustrating a state in which the spacers 34A are formed. As can be seen from FIG. 5B, the spacers 34A are formed on the sidewalls of the word lines 32.

Figure 3J:
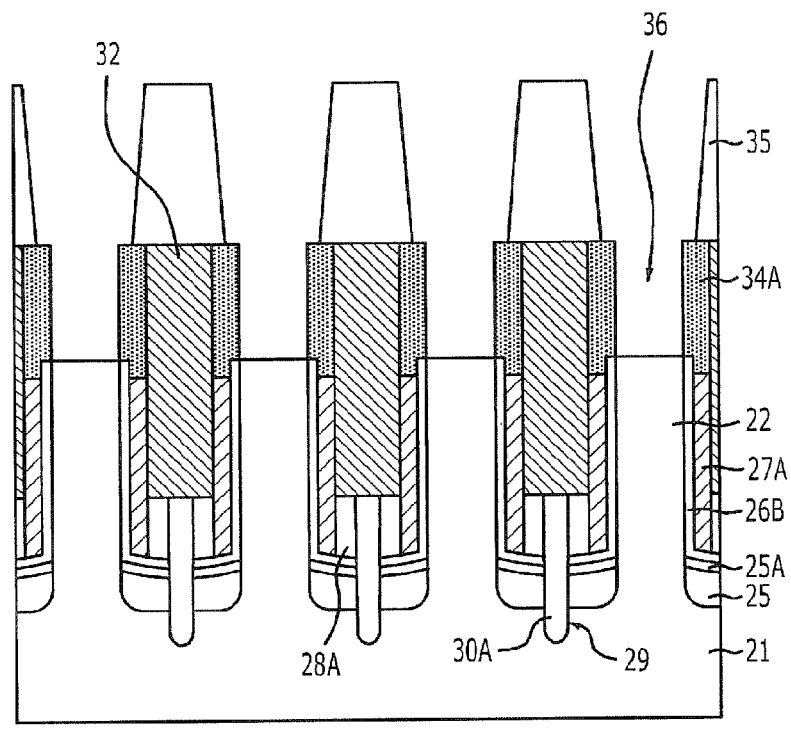

Referring to FIG. 3J, a third interlayer dielectric layer 35 is formed over a resulting structure, and contact holes 36 are formed to expose the surfaces of the first active pillars 22. The third interlayer dielectric layer 35 includes an oxide layer. For example, the third interlayer dielectric layer 35 may be formed of oxide, for example, HDP oxide, BPSG, SOD, TEOS, USG, and ALD oxide. To be specific, the third interlayer dielectric layer 35 is formed of flowable oxide such as SOD or BPSG.

Figure 3K:
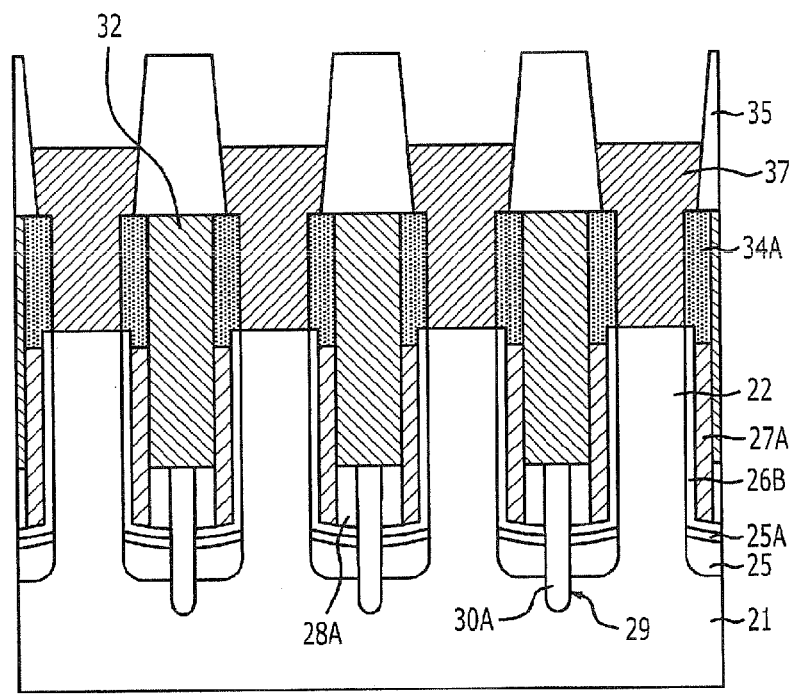

Referring to FIG. 3K, second active pillars 37 are formed on the first active pillars 22 exposed under the contact holes 36. The second active pillars 37 may be formed by an epitaxial growth process. To be specific, the second active pillars 37 may be formed by a selective epitaxial growth (SEG) process or a solid phase epitaxy (SPE) process. The second active pillars 37 may include a silicon epitaxial layer formed by an SEG process or an SPE process.

The second active pillars 37 become drain regions of the vertical transistors. As such, the active pillars are not formed at once, taking into consideration both the channel region and the drain region, but the first active pillars 22 functioning as the channel regions are first formed and the second active pillars 37 to be formed as the drain regions in a subsequent process are then formed. By forming the first active pillars 22 and the second active pillars 37 separately, the collapse of the pillars is prevented, and thereby a stable pillar structure may be obtained. Furthermore, since the pad layer is used only when the first active pillars 22 are formed, the pad layer need not be thick. Thus, the collapse of the pillars is further prevented. Moreover, since the pad layer is not used when the second active pillars 37 are formed, loss of the pad layer is minimized.

Figure 5C:
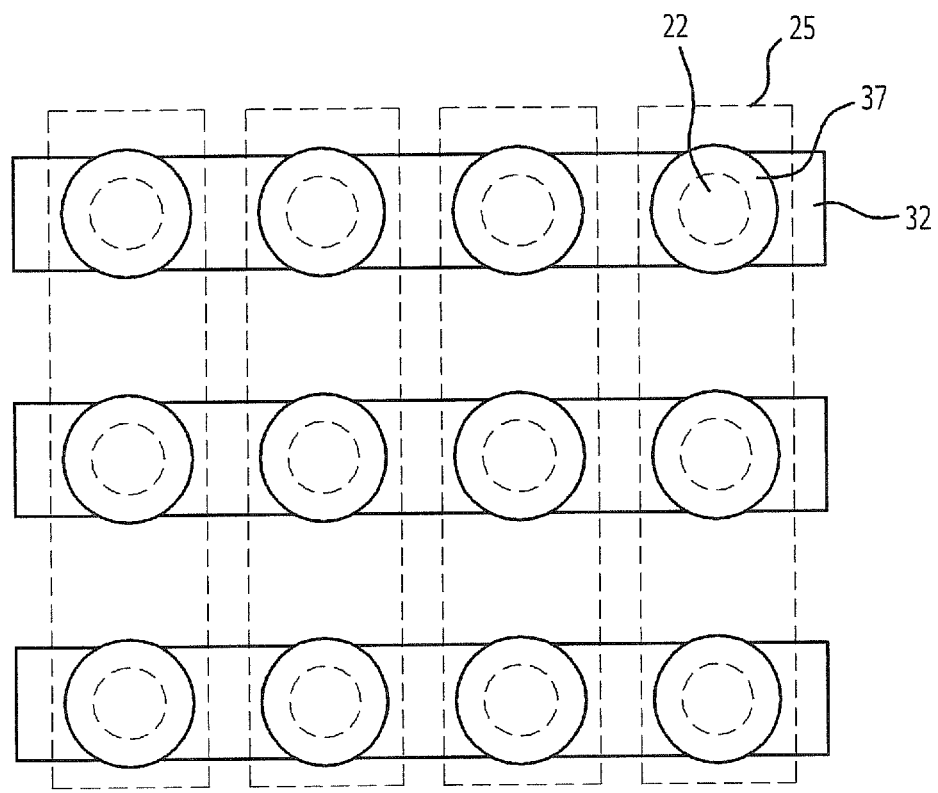
FIG. 5C is a plan view illustrating a state in which second active pillars are formed.

FIG. 5C is a plan view illustrating a state in which the second active pillars 37 are formed. As can be seen from FIG. 5C, the second active pillars 37 are formed over the first active pillars 22.

Figure 3L:
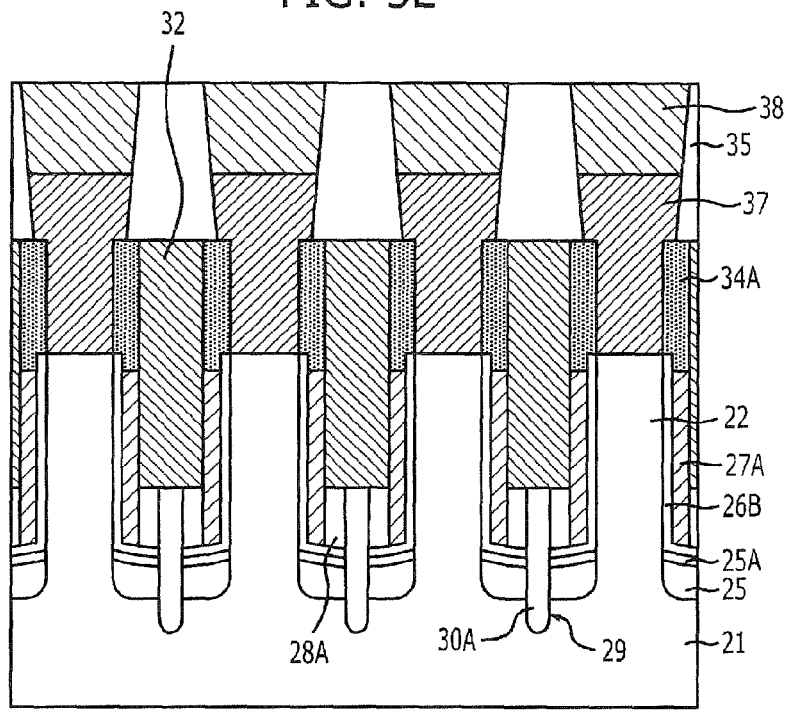

Referring to FIG. 3L, storage node contacts 38 are formed on the second active pillars 37. The storage node contacts 38 may include a polysilicon layer, a titanium nitride layer, or a tungsten layer. For example, the storage node contacts 38 may be formed by stacking a polysilicon plug and a barrier layer in the order mentioned, or stacking a barrier layer and a tungsten plug in the order mentioned. Furthermore, the storage node contacts 38 may be formed by stacking a tungsten plug and a barrier layer in the order mentioned. The barrier layer may include a titanium nitride layer.

In the first embodiment, the storage node contacts 38 are formed after contact holes 36 are partially filled with the second active pillars 37 in a one-time contact hole process. However, in another embodiment, the second active pillars 37 are formed to fill the contact holes 36 completely, and then, a storage node contact hole process is additionally performed to form the storage node contacts 38.

Figure 4:
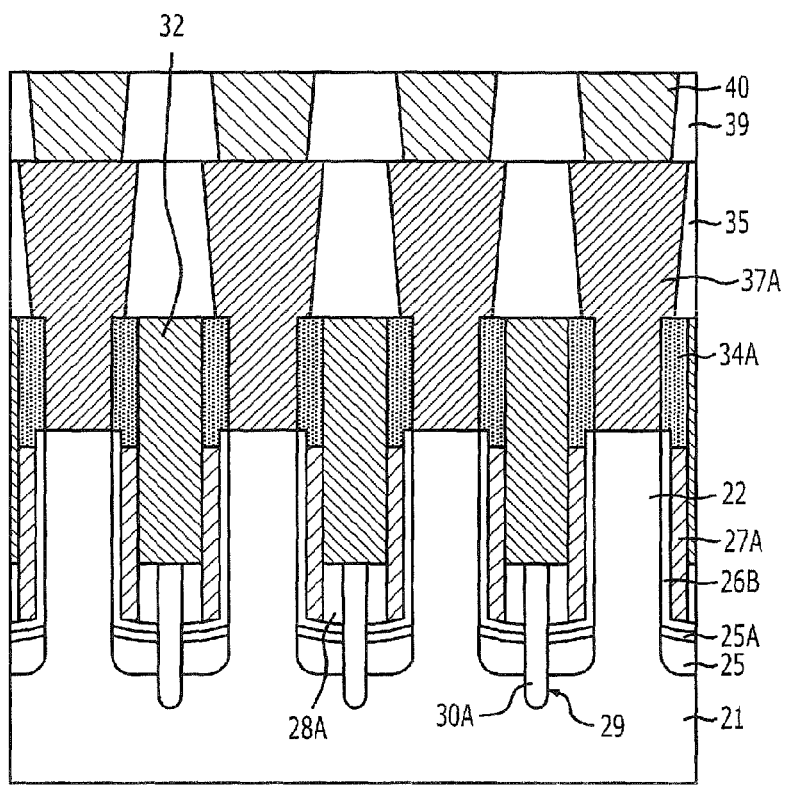
FIG. 4 is a cross-sectional view of a semiconductor device in accordance with a second embodiment of the present invention.

FIG. 4 is a cross-sectional view of a semiconductor device in accordance with a second embodiment of the present invention. Storage node contacts may be formed after second active pillars 37A are formed until filling contact holes completely. In case of completely filling the contact holes with the second active pillars 37A, the surface of a resulting structure may be planarized by a CMP process.

Referring to FIG. 4, the second active pillars 37A are formed to completely fill contact holes formed by etching a third interlayer dielectric layer 35, and a fourth interlayer dielectric layer 39 is formed. Storage node contact holes are formed to expose the second active pillars 37A. Storage node contacts 40 are formed to fill the storage node contact holes. The storage node contacts 40 may be formed of polysilicon, titanium nitride, or tungsten. For example, the storage node contacts 40 may be formed by stacking a polysilicon plug and a barrier layer in the order mentioned, or stacking a barrier layer and a tungsten plug in the order mentioned. Furthermore, the storage node contacts 40 may be formed by stacking a tungsten plug and a barrier layer in the order mentioned. The barrier layer may include a titanium nitride layer.

In the second embodiment, the contact hole process for forming the second active pillars 37A and the storage node contact hole process for forming the storage node contacts 40 are performed separately.

FIGS. 6A to 6D are cross-sectional views illustrating a method for fabricating a semiconductor device in accordance with a third embodiment of the present invention. The third embodiment is a modification of the first embodiment.

The fabricating process up to formation of an etch barrier layer 41 is performed as illustrated in FIGS. 3A to 3H.

Figure 6A:
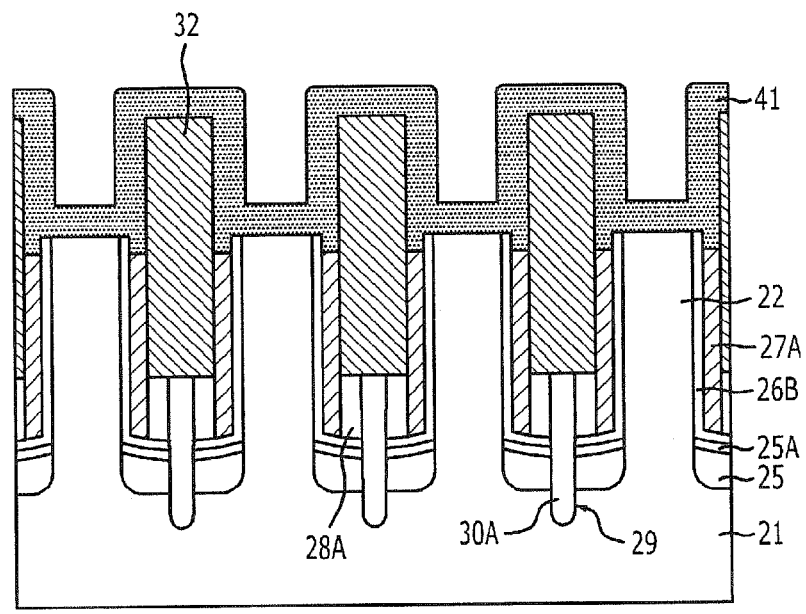
FIGS. 6A to 6D are cross-sectional views illustrating a method for fabricating a semiconductor device in accordance with a third embodiment of the present invention.

Referring to FIG. 6A, an etch barrier layer 41 is formed over a resulting structure to gap-fill the grooves. The etch barrier layer 41 is formed for achieving a self align in a subsequent etch process, and a nitride layer is deposited to a thickness ranging from approximately 100 Å to approximately 300 Å.

The etch barrier layer 41 prevents a bridge between subsequent second active pillars and vertical gates or between second active pillars and word lines.

Figure 6B:
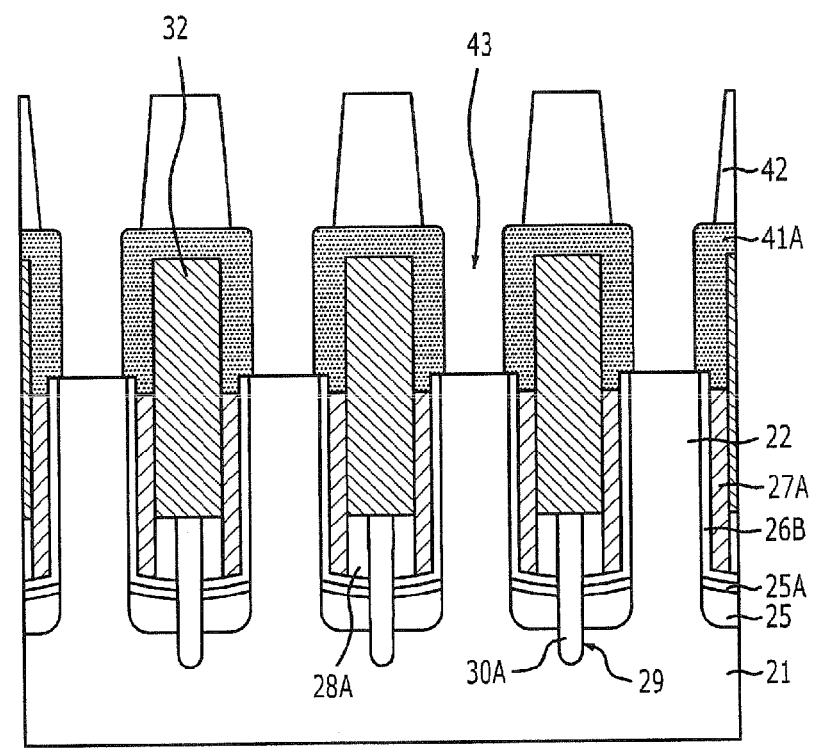

Referring to FIG. 6B, a third interlayer dielectric layer 42 is formed over a resulting structure, and contact holes 43 are formed to expose the surfaces of the first active pillars 22. In order to form the contact holes 43, the third interlayer dielectric layer 42 is etched so that the etching is stopped at the etch barrier layer 41, and continuously, the etch barrier layer 41 is etched to expose the surfaces of the first active pillars 22. The etch barrier layer 41 partially etched becomes an etch barrier 41A.

The third interlayer dielectric layer 42 includes an oxide layer. For example, the third interlayer dielectric layer 42 may be formed of oxide, for example, HDP oxide, BPSG, SOD, TEOS, USG, or ALD oxide. To be specific, the third interlayer dielectric layer 42 is formed of flowable oxide such as SOD or BPSG.

Figure 6C:
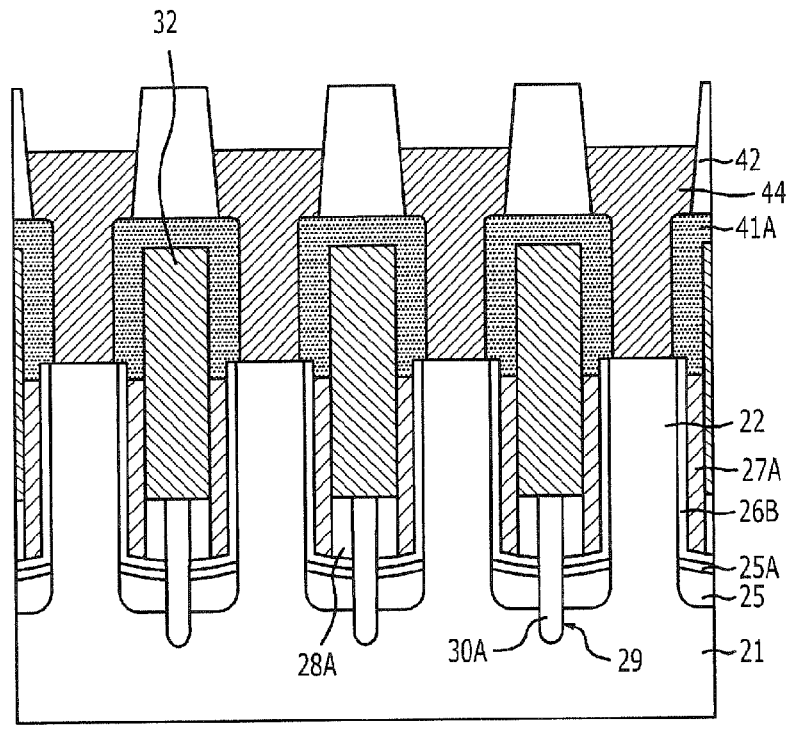

Referring to FIG. 6C, second active pillars 44 are formed on the first active pillars 22 exposed under the contact holes by an epitaxial process. The second active pillars 44 may be formed by an SEG process or an SPE process. For example, the second active pillars 44 may include a silicon epitaxial layer formed by an SEG process or an SPE process.

The second active pillars 44 become drain regions of the vertical transistors. As such, the active pillars are not formed at once, with respect to both the channel region and the drain region, but the first active pillars 22 functioning as the channel regions are first formed and the second active pillars 44 to be formed as the drain regions are then formed in a subsequent process. By forming the first active pillars 22 and the second active pillars 44 separately, the collapse of the pillars is prevented, and thereby a stable pillar structure may be obtained. Furthermore, since the pad layer is used only when the first active pillars 22 are formed, the pad layer need not be thick. Thus, the collapse of the pillars is further prevented. Moreover, since the pad layer is not used when the second active pillars 44 are formed, loss of the pad layer may be minimized.

Figure 6D:
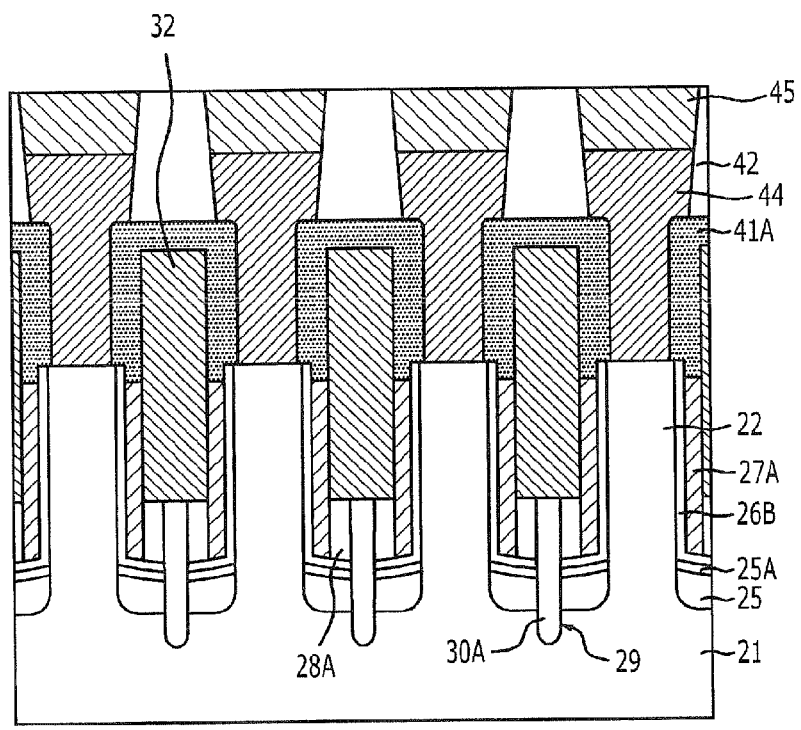

Referring to FIG. 6D, storage node contacts 45 are formed on the second active pillars 44. The storage node contacts 45 may include a polysilicon layer, a titanium nitride layer, or a tungsten layer. For example, the storage node contacts 45 may be formed by stacking a polysilicon plug and a barrier layer in the order mentioned, or stacking a barrier layer and a tungsten plug in the order mentioned. Furthermore, the storage node contacts 45 may be formed by stacking a tungsten plug and a barrier layer in the order mentioned. The barrier layer may include a titanium nitride layer.

In the third embodiment, the storage node contacts 45 are formed after partially filling the contact holes with the second active pillars 44 in a one-time contact hole process. However, in another embodiment, the second active pillars 44 are formed until filling the contact holes completely, and then, a storage node contact hole process is additionally performed to form the storage node contacts.

Figure 7:
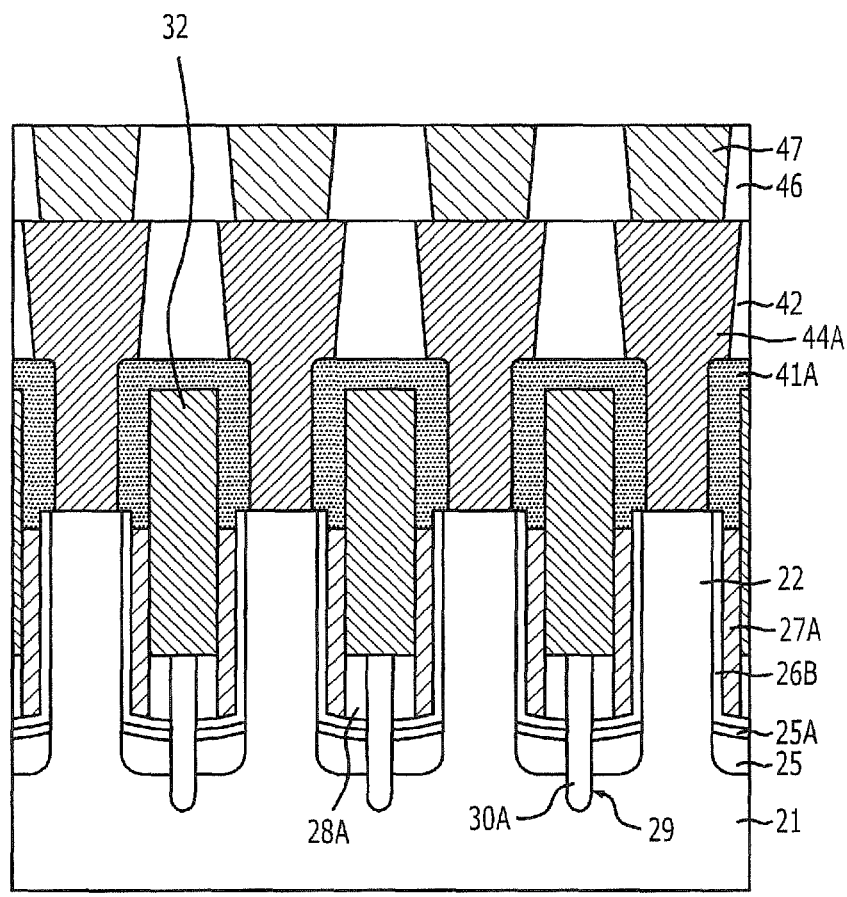
FIG. 7 is a cross-sectional view of a semiconductor device in accordance in accordance with a fourth embodiment of the present invention.

FIG. 7 is a cross-sectional view of a semiconductor device in accordance in accordance with a fourth embodiment of the present invention. Storage node contacts 47 may be formed after second active pillars 44A are formed until filling contact holes completely. In case of completely filling the contact holes with the second active pillars 44A, the surface of a resulting structure may be planarized by a CMP process.

Referring to FIG. 7, the second active pillars 44A are formed to completely fill contact holes formed by etching a third interlayer dielectric layer 42, and a fourth interlayer dielectric layer 46 is formed. Storage node contact holes are formed to expose the second active pillars 44A.

Storage node contacts 47 are formed to fill the storage node contact holes. The storage node contacts 47 may be formed by stacking a polysilicon plug and a barrier layer in the order mentioned, or stacking a barrier layer and a tungsten plug in the order mentioned. Furthermore, the storage node contacts 40 may be formed by stacking a tungsten plug and a barrier layer in the order mentioned. The barrier layer may include a titanium nitride layer.

As mentioned above, in the fourth embodiment, the contact hole process for forming the second active pillars 44A and the storage node contact hole process for forming the storage node contacts 47 are performed separately.

In accordance with the embodiments of the present invention, since the first active pillars functioning as the channel regions of the vertical transistors and the second active pillars functioning as the drain regions of the vertical transistors are formed separately, the collapse of the pillars is prevented, and thereby a stable pillar structure is obtained.

In addition, since the pad layer is used only when the first active pillars are formed, the pay layer need not be thick, and thus, the collapse of the pillars is further prevented. Since the pad layer is not used when the second active pillars are formed, loss of the pad layer is minimized. Furthermore, since the vertical gates are formed after forming the first active pillars with a small height, it is easy to remove the gate conductive layer other than the channel region.

Moreover, since the spacers or etch barrier layer is used, bridge caused by misalignment can be prevented.

Consequently, even though the aspect ratio of the active pillars increases, a stable pillar structure can be obtained and the channel length of the vertical gate can be constantly maintained. Moreover, the resistances of the bit lines and the word lines can be reduced and the uniformity of the resistance can be improved.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, the method comprising:

forming a plurality of first active pillars by etching a substrate using a pad layer as an etch barrier;

forming a plurality of gate conductive layers surrounding sidewalls of the first active pillars and the pad layer;

forming a plurality of word lines buried between the gate conductive layers to connect the adjacent gate conductive layers;

removing the pad layer;

forming a plurality of vertical gates by etching upper portions of the gate conductive layers to partially expose sidewalls of the word lines;

forming an etch barrier layer over a resulting structure including the vertical gates;

forming an interlayer dielectric layer over the etch barrier layer;

forming a plurality of contact holes by etching the interlayer dielectric layer, where the etching stops at the etch barrier layer;

etching the etch barrier layer under the contact holes to expose surfaces of the first active pillars; and forming a plurality of second active pillars over the exposed first active pillars.

2. The method of claim 1, wherein the second active pillars are formed by an epitaxial growth process.

3. The method of claim 2, wherein the epitaxial growth process is performed using a selective epitaxial growth (SEG) process or a solid phase epitaxy (SPE) process.

4. The method of claim 1, wherein the vertical gates are formed by dry etching or wet etching the gate conductive layers so that the vertical gates are lower than surfaces of the first active pillars.

5. The method of claim 1, further comprising, before forming the gate conductive layers:

forming sacrificial spacers covering the sidewalls of the first active pillars;

forming buried bit lines within the substrate by impurity ion implantation; and removing the sacrificial spacers.

6. The method of claim 5, further comprising forming silicide over the buried bit lines.

7. The method of claim 5, further comprising, before forming the plurality of word lines, forming trenches to separate the buried bit lines.

\* \* \* \* \*